United States Patent [19]

Knauer et al.

[11] 4,064,491
[45] Dec. 20, 1977

[54] INFORMATION MEMORY FOR STORING INFORMATION IN THE FORM OF ELECTRIC CHARGE CARRIERS AND METHOD OF OPERATING THEREOF

[75] Inventors: Karl Knauer, Gauting; Hans Jöerg Pfleiderer, Zorneding, both of Germany

[73] Assignee: Siemens Aktiengesellschaft, Berlin & Munich, Germany

[21] Appl. No.: 723,312

[22] Filed: Sept. 15, 1976

[30] Foreign Application Priority Data

Sept. 30, 1975 Germany .............................. 2543628

[51] Int. Cl.² ............................................. G11C 11/24
[52] U.S. Cl. ................................... 365/149; 307/303; 357/51; 365/174
[58] Field of Search .................. 340/173 CA; 357/15, 357/23, 51; 307/303

[56] References Cited

PUBLICATIONS

Terman, Small Area Stored Charge Memory Cells, Sept. 1972, IBM Technical Disclosure Bulletin, vol. 15, No. 4, pp. 1227-1229.
Sodini, et al., Enhanced Capacitor for One-Transistor Memory Cell, IEEE Transactions on Electron Devices, Oct. 1976, pp. 1187-1189.

*Primary Examiner*—Stuart N. Hecker
*Attorney, Agent, or Firm*—Hill, Gross, Simpson, Van Santen, Steadman, Chiara & Simpson

[57] ABSTRACT

An information memory for storing information in the form of electric charge carriers has at least one dynamic storage element which is arranged upon a surface of at least one substrate made of semiconductor material and doped with a given basic type doping. The substrate connection is included and the memory comprises at least one MIS capacitor. Upon the substrate surface at least one electrically insulating layer is present which carries at least one capacitor electrode. The dynamic storage element comprises the MIS capacitor or an adjacent arrangement of several MIS capacitors, separated from one another by, at the most, narrow distances and comprises at least one contact area at the substrate surface which is provided with an externally accessible ohmic terminal contact, and which contacts at least the margin of the MIS capacitor or t least one of the MIS capacitors, nd which contains material having the basic type of doping. Within the electrically insulating layer, within the MIS capacitor or capacitors, the values of the numerical ratio $\epsilon/d$—whereby $\epsilon$ is the dielectric constant and $d$ is the layer thickness of the electrically insulating layer—and/or the values of the surface density of the basic type of doping of the substrate in the area or in the areas of the MIS capacitor or capacitors and/or the values of the surface density, with respect to the surface of the substrate, of and adjacent to the substrate and doped opposite to the type of doping of the substrate layer, are selected differently with respect to location in such a way that, by the way of applying an electrode voltage, which may be given within a wide range between the substrate terminal and electrode, the local distribution of the amounts of the potential maximum between the range or within the ranges of the MIS capacitor or capacitor, comprises, laterally away from the contact area beginning at the side of the contact area, at least one increase from a minimum value to a maximum value.

18 Claims, 15 Drawing Figures

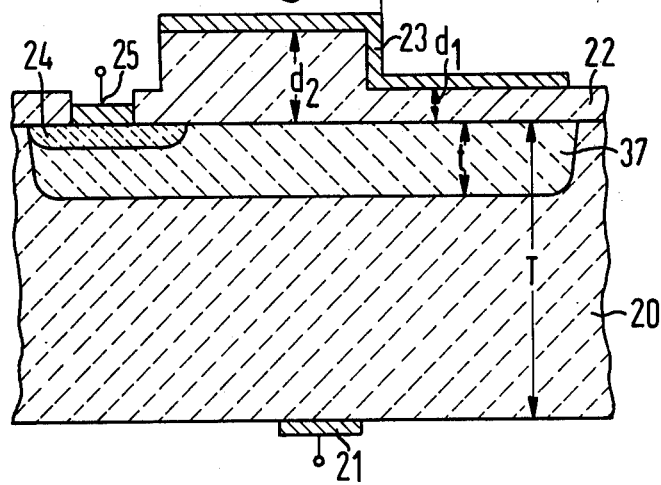
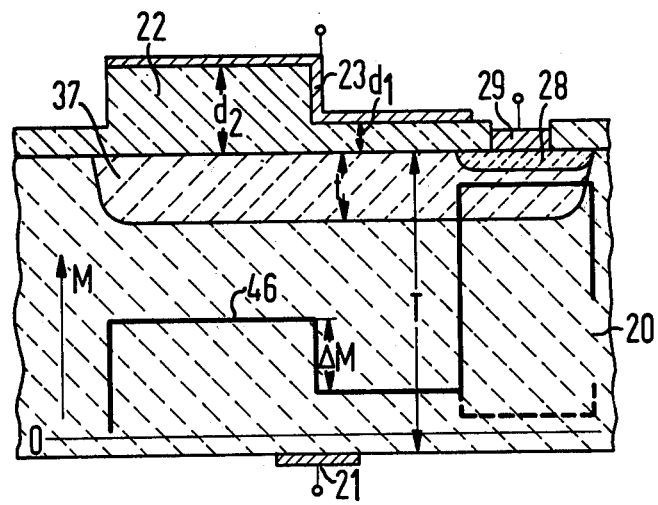

INFORMATION MEMORY FOR STORING INFORMATION IN THE FORM OF ELECTRIC CHARGE CARRIERS AND METHOD OF OPERATING THEREOF

BACKGROUND OF THE INVENTION

1. Field of the Invention

The present invention relates to an information memory for storing information in the form of electric charge carriers comprising at least one dynamic storage element which is arranged upon a surface of at least one substrate of the semiconductor material which is doped with a predeterminable basic type of doping and having a substrate connection, and comprising at least one MIS capacitor, whereby at least one electrically insulating layer carrying at least one capacitor electrode is present upon the substrate surface.

2. Description of the Prior Art

It is an important development goal for information memories to provide memory elements requiring little space in order to increase the storage density. In the case of memories of the type mentioned above, a high storage density is obtained with the help of dynamic single-transistor memory elements. Such a single-transistor memory element is described, for example, in the publication "A One Mil$^2$ Single-Transistor Memory Cell in n-Silicon Gate Technology" by Karl-Ulrich Stein and Hans Friedrich in the IEEE Journal of Solid State Circuits, Vol. SC 8, No. 5, October 1973. The memory element consists of an MIS transistor and an MIS capacitor of the type mentioned above. The electrode of the capacitor is connected to a ground line and the gate electrode of the transistor is connected to a word line. The opposite electrode of the capacitor, which is positioned within the substrate, is connected to a bit line, by way of the transistor. An exemplary embodiment of this single-transistor storage element is set forth in the abovementioned publication on Page 321, in FIG. 4.

SUMMARY OF THE INVENTION

It is the object of the present invention to provide an information memory of the type mentioned above, in which the dynamic memory element has a smaller surface requirement than conventional elements.

This object is achieved in such a manner that the dynamic memory element comprises an MIS capacitor or an adjacent arrangement of several MIS capacitors which are, at the most, separated by a small spaces from one another, and at least one contact area on the substrate surface which is provided with an externally accessible ohmic connection contact and which contacts at least the margin of the MIS capacitor, or, at least, one of the MIS capacitors, and which contains a material having a crystal diode effect with the basic type of doping. At the contact points with the substrate that, in the electrically insulating layer of the MIS capacitor the values of the ratio $\epsilon/d$, where $\epsilon$ is the dielectric constant and $d$ the layer thickness of the electrically insulating layer, and/or the values of the surface density of the basic type of doping of the substrate in the MIS capacitor, in relation to the surface of the substrate, or in the area of the MIS capacitor or capacitors and/or the values of the surface density of a layer in the substrate, related to the surface of the substrate, adjacent to the substrate surface and doped opposite to the type of substrate doping, are selected locally different in such a way that when an electrode voltage is applied which can be predetermined within wide ranges, between the substrate terminal and the electrode, the local distribution of the amounts of potential maximum in the MIS capacitor (capacitors), or in the areas of the MIS capacitor (or capacitors), comprises at least one increase from a minimum value to a maximum value laterally away from the contact area. In the case of a plurality of MIS capacitors, the spacing between the capacitors must be so small that the marginal fields produced by voltages at the electrodes during operation extend beyond the spaces between two capacitors, thus that no potential thresholds to hinder the charge flow will be produced below the spaces. The width of such a space which is sufficient for this condition depends upon the operational voltage and upon the doping of the substrate therebelow. Generally, the spacing of less than 3 $\mu$m can be assumed as a directional value. The mathematic expression $dN/dF$ is meant by the expression "surface density of a doping with respect to a reference surface", whereby $dN$ refers to the entire doping contained within a cylinder extending perpendicular to the reference surface and extending over the entire doped material, upon the basic surface $dF$. In the present case, the reference surface is always the substrate surface.

An information memory is preferably designed in such a manner that the electrically insulating layer within the MIS capacitor or capacitors—beyond the contact area—does not have, in all places, the same value of the numerical ratio $\epsilon/d$, whereby, for the case that the substrate is doped homogeneously, the numerical ratio, laterally outwardly of the contact area, decreases from a higher value to a lower value, and/or, that, at least within the MIS capacitor or capacitors, or in the areas of the MIS capacitor or capacitors, the surface density of the basic type of doping outward of the contact area, with respect to the substrate surface, has at least a decrease from a predeterminable value to a lower value, and/or that the surface density of the layer doped opposite with respect to the substrate, with respect to the substrate surface, and laterally away from the contact area comprises at least an increase from a predeterminable value to a higher value.

All materials are suited for the contact area which produce a crystal diode effect upon contact with the substrate of the basic type of doping. This area may, for example, be a Schottky contact attached to the surface of the substrate. However, it is advantageous with respect to the production of a complete memory matrix, when the contact area consists of a range in the substrate which is doped opposite with respect to the substrate and located adjacent to the surface of the substrate and having a doping which is higher than the remaining dopings present in the substrate and comprising the ohmic connection contact at the surface of the substrate.

Due to cost resons, care must be taken during the production of an information memory constructed in accordance with the invention so as to have as few steps as possible. It is thus advantageous when the memory element does not unite all previously mentioned alternatives in itself. Advantageous embodiments considering this will become apparent from the various features of the invention described below. In practical cases, an information memory will be designed in such a way that several memory elements are arranged in a matrix of lines and columns, upon a common substrate, that the contact areas of the individual elements of a column are combined to form an individual common column line in the form of a doped strip within the substrate which has an ohmic terminal contact and which is extended along the elements at the column, and that the electrodes of the elements in one line are combined to form an individual line conductor in the form of a strip of an electrically conductive material which, upon an electrically insulating layer, is extended over all of the elements of a line.

An information memory element constructed in accordance with the invention is operated in such a way that a reference voltage is applied to the substrate terminal and that, for reading the information into the element, an electrode voltage U, with respect to a reference voltage is applied to the electrode to produce a maximum potential difference $\Delta M$ in the MIS capacitor area, and that a voltage is applied to the contact area which, in magnitude, is either larger or smaller than the amount of the minimum voltage that, for storage purposes, a voltage is applied to the contact area having a larger amount than the amount of the minimum value, and that, for reading out information, the electrode voltage is changed in such a way that $\Delta M$ is decreased, whereby a voltage is applied to the contact area which, in magnitude, is larger than the new minimum value.

An information memory constructed in accordance with the invention, as compared with conventional information memories, is characterized by a particularly simple construction and particularly high storage density. Furthermore, the memory constructed in accordance with the present invention can be produced in fewer method steps than conventional memories. In addition, the operation of the memory is also very simple.

BRIEF DESCRIPTION OF THE DRAWINGS

FIGS. 2, 3 and 4 illustrate a cross sectional view of exemplary embodiments of information memories, wherein the electrically insulating layer upon the substrate comprises different layer thicknesses;

DESCRIPTION OF THE PREFERRED EMBODIMENTS

In order to provide a better understanding of the principles of the present invention, a general observation should first be made; in an arrangement having a doped substrate with a substrate connection carrying an electrically insulating layer upon a surface upon which an electrode is attached, it is possible, when the reference voltage at the substrate terminal is known and when a voltage at the electrode is known, to calculate the potential distribution within the electrically insulating layer and within the substrate in accordance with the one-dimensional Poisson equation $d^2\phi/dx^2 = -\phi/\epsilon$, with the boundary conditions that the potential at the substrate surface at the substrate terminal is equal to the reference voltage and, at the insulating surface below the electrode is equal to the given electrode voltage, and that the potential on the separating surfaces which separate two different materials from each other is continuous. It can, first of all be taken from the equation that at least one electrode voltage $U_0$ exists on the terminal balance at a given reference voltage at the substrate terminal, whereby no electric field is present in the electrically insulating layer between the substrate and the electrode, thus that the potential in this layer is constant. The voltage $U_0$ thereby only depends on the material properties of the electrically insulating layer (dielectric constant) and on layer thicknesses of differently doped layers in the substrate and their dopings. The potential maximum in the substrate changes with a shift of the electrode voltage away from $U_0$; here and in the following discussion, the direction of the reference voltage in accordance with $U_0$ is assumed to be positive, independent of the polarity of $U_0$. This change is different in the case of different parameters (layer thicknesses, dopings and dielectric constants).

Figure 1:
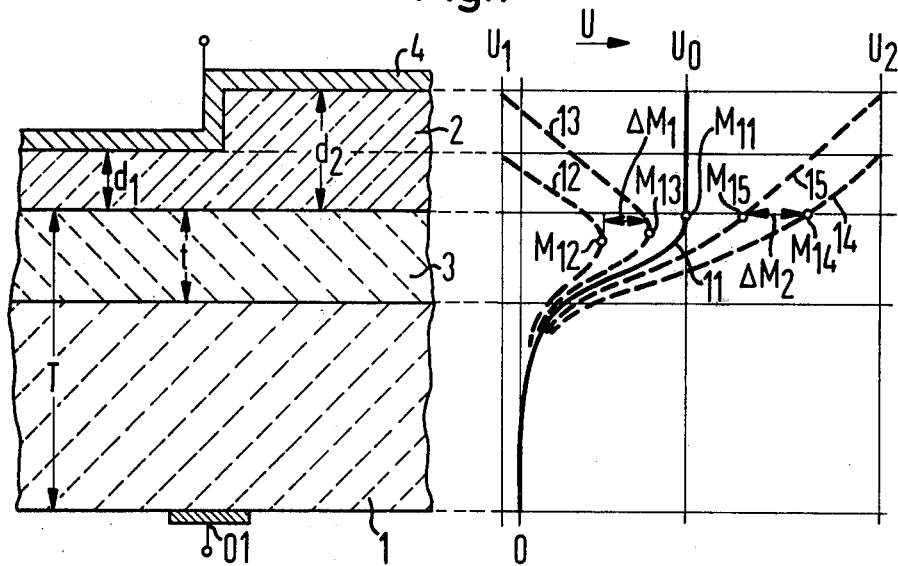
FIG. 1 is a cross sectional view of an MIS capacitor having an electrically insulating layer of different thickness upon a surface of the substrate, whereby doping is opposite with respect to the remaining substrate at this surface, and adjacent thereto potential paths as they occur in the inner surface at different voltages.

This is to be further explained with the help of FIG. 1. In FIG. 1, potential curves are illustrated as they occur in the case of the above-described arrangement. An electrically insulating layer 2 having two different layer thicknesses $d_1$ and $d_2$ is applied onto the surface of a substrate 1 which is provided with a substrate terminal 01 and having a layer thickness T, the layer 2 thereby having two different layer thicknesses $d_1$ and $d_2$. An oppositely doped layer 3 is carried on this surface, the layer 3 having a layer thickness $t$ within the substrate 1. An electrode 4 is applied to the electrically insulating layer. On the right-hand side, the curve 11 illustrates the potential path in the electrically insulating layer and in the substrate when the voltage $U_0$ is applied to the electrode. Such a state is assumed in thermal equilibrium, whereby the layer 3, which is oppositely doped with respect to the substrate 1, is entirely depleted of majority carriers. As can be seen in FIG. 1, the potential in the electrically insulating layer is constant, independent of layer thickness. The potential maximum in the substrate is located at the surface facing the electrically insulating layer and is referenced $M_{11}$. If a voltage $U_1$ is applied, where $|U_1| < |U_0|$ or a polarity opposite to the potential $U_0$, then the potential curve 12 forms below the electrically insulating layer having the layer thickness $d_1$, while the potential path 13 is produced below the electrically insulating layer having the larger layer thickness $d_2$. The two potential maximums $M_{12}$ and $M_{13}$ are, in both cases, located in the inner part of the substrate and are spaced apart a distance $\Delta M_1$ from each other. If, however, a voltage $U_2$, where $|U_2| > |U_0|$, is applied to the electrode, the potential curves 14 and 15 are produced. The potential curve 14 belongs to the thinner electrically insulating layer and the potential curve 15 belongs to the thicker electrically insulating layer. The potential maxima $M_{14}$ and $M_{15}$ are spaced apart a distance $\Delta M_2$ from each other and are positioned at the substrate surface facing the electrically insulating layer. It is thereby generally true that, for voltages $U_1$, the absolute potential maximum is located below the thicker electrically insulating layer, while, for voltages $U_2$, it is located below the thinner electrically insulating layer. Furthermore, it is generally true that the potential differences $\Delta M_1$ or $\Delta M_2$, respectively, increase with increasing magnitude from $U_1$ or $U_2$, respectively, away from the voltage $U_0$. When the voltage $U_1$ or $U_2$, respectively, approach the voltage $U_0$, the differences $\Delta M_1$ or $\Delta M_2$, respectively, decrease and assume the value 0 at $U_1 = U_0$ or $U_2 = U_0$, respectively. The conditions just described are, analogously, true for the expanded case when $d_1/\epsilon_1 < d_2/\epsilon_2$ holds true in the electrically insulating layer. For the case when a layer, doped opposite with respect to the substrate, is not present, the conditions are similar. These conditions become complicated only when the layer thickness of the layer doped opposite with respect to the substrate has a non-uniform doping of non-uniform layer thickness. In this case, not only a voltage $U_0$ will exist, but two or several such voltages. In the case of a continuous change, there will even be a range of voltages $U_0$. It is now generally true, with the exception of possible singular cases, that in the case of structures such as those illustrated in FIG. 1 having differing layer thicknesses of the electrically insulating layer or doped layers in the substrate and/or in the case of layers in the substrate with differing and in particular lateral, doping, different potential maxima are formed in the substrate when an electrode voltage is applied to the electrode. When this electrode voltage is changed, the spacing $\Delta M$ between two different potential maxima generally changes also. This effect can be utilized for constructing information memories of the type initially mentioned.

Figure 2:
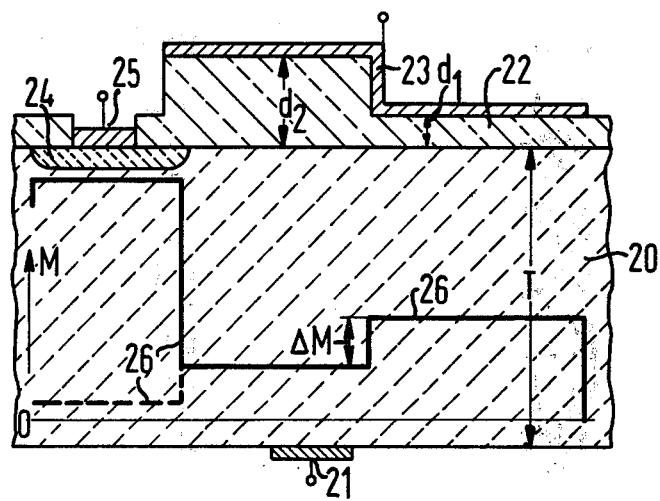

A first exemplary embodiment of such an information memory is illustrated in FIG. 2. A step-type electrically insulating layer 22, for example made of silicon dioxide, having two layer thicknesses $d_1$ and $d_2$ is applied onto a substrate 20, for example p-doped silicon having a substrate terminal 21. The electrically insulating layer 22 carries an electrode 23. A contact area 24 in the substrate, which is highly doped with respect to the substrate, is present at the surface of the substrate and is provided with an externally accessible ohmic terminal contact 25, and is doped opposite with respect to the substrate and consists of the same material as the substrate. The contact area 24 is thereby located at the boundary of the electrode, namely upon the electrode side below which the larger layer thickness $d_2$ is present. The operation of the information memory illustrated in FIG. 2 is as follows. A reference voltage U is applied to the substrate terminal 21. A voltage $U_2$ is applied to the electrode 23, where $|U_0| < |U_2|$. The voltage $U_0$, in the case of this information memory, is provided by the reference voltage. The polarity of the voltage $U_2$ must be selected in such a way that its sign coincides with the majority carrier of the doped substrate. The curve 26 drawn in the substrate illustrates the local path of the potential maximum M. The curve 26, below the step in the electrically insulating layer, comprises a magnitude jump $\Delta M$. The potential value which has a larger amount is therefore located below the thinner electrically insulating layer.

For reading-in of information, the contact area 24 is now provided with a voltage $U_K$ with respect to the reference voltage, via the terminal 25, which has either a larger magnitude than the smaller of the potential maxima in the substrate below the electrode 23, or which has a smaller magnitude or the opposite sign from the potential maximum, respectively. In the first case, charge carriers cannot flow into the zone below the thinner electrically insulating layer, while in the second case, charges may flow in that zone. The continuous portion of the curve 26 below the contact area 24 is true for the first case, while the broken-line portion holds true for the second case. For storing the read-in information, a voltage is applied to the contact area which, in magnitude, is larger than the smallest potential maximum in the substrate. For reading-out the information, the electrode voltage $U_2$ is changed in the direction of the voltage $U_0$ or beyond that voltage, while a voltage is applied to the contact area which, in magnitude, is larger than the smallest potential maximum. Due to change in the electrode voltage in the direction of $U_0$, the difference $\Delta M$ between the two potential maxima is decreased, so that charge carriers which might possibly have previously entered, flow off into the contact area and the information is thus read-out.

The following values may, for example, be assumed for the information memory constructed in accordance with FIG. 2: A p-doped silicon substrate having a doping of $5 \cdot 10^{15} \text{cm}^{-3}$ and having a thickness $T = 400 \mu m$; a n-doped silicon contact area having a doping of $1 \cdot 10^{20} \text{cm}^{-3}$, a silicon dioxide electrically insulating layer having a thickness $d_1 = 50$ nm and a thickness $d_2 = 300$ nm. During read-in and storage, a voltage of 15 volts can be used as electrode voltage, and during the read-out process, a voltage of 5 volts may be applied. In the case of an electrode voltage of 15 volts, the potential maximum below the thinner electrically insulating layer has a value of approximately 13 volts, while below the thicker electrically insulating layer it has a value of approximately 5 volts. In the case of the electrode voltage of 5 volts, the potential maximum below the thinner electrically insulating layer has a value of approximately 5 volts, while it has a value of approximately 1 volt below the thicker electrically insulating layer. Accordingly, M has only a value of 3 volts. During the read-in process, the voltage at the contact area must thus either be larger or smaller than 6 volts, while it must be larger than 6 volts during the storage process. During the read-out process, the voltage at the contact area must be larger than 1 volt. In practice, the voltage at the contact area is rendered as large as possible, at least during the storage and read-out processes, for example larger than 30 volts.

FIG. 3 illustrates a modification of the information memory constructed in accordance with FIG. 2. The memory of FIG. 3 differs from the memory of FIG. 2 only in that the substrate is redoped down to a depth $t$, below the electrode at the substrate surface with respect to the electrically insulating layer. This redoped layer is referenced 27. The remaining elements correspond to those of the memory illustrated in FIG. 2 and are thus provided with corresponding reference characters.

During the operation of the information memory illustrated in FIG. 3, the potential curves illustrated in FIG. 1 are authoritative. In accordance therewith, a primary difference with respect to the previously described information memory is provided in that the potential $U_0$ differs now essentially from the reference voltage at the substrate terminal. Otherwise, the information is operated in an analogous manner with respect to the memory illustrated in FIG. 2. The following exemplary values may be used in the design of the information memory in accordance with FIG. 3: a p-doped silicon substrate has a doping of $5 \cdot 10^{14}$ cm$^{-3}$ and a thickness of T = 400 μm; an n-doped layer with a doping of $10^{15}$ cm$^{-3}$ and a layer thickness $t = 1$ μm, an electrically insulating layer of silicon dioxide having a thickness $d_1 = 1200$ nm and a thickness $d_2 = 1200$ nm and a doping of the contact area of $10^{20}$ cm$^{-3}$.

During the read-in and storage process, a voltage of 30 volts may be used as an electrode voltage, which causes a potential maximum of approximately 28.4 volts below the thinner electrically insulating layer and approximately 18.5 volts below the thicker electrically insulating layer. This corresponds to a value of ΔM of 9.9 volts. During the read-out process, an electrode voltage of 10 volts can be used. This voltage causes a potential maximum of 9.3 volts below the thinner electrically insulating layer and of 6.1 volts below the thicker electrically insulating layer, thus a decrease of ΔM to 3.2 volts. Analogously, the voltage at the contact area must comply with the conditions of the method described with respect to FIG. 2. Advantageously, the voltage at the contact area is selected larger than 30 volts, at least during the storage and read-out processes.

FIG. 4 illustrates a variation of the information memory constructed in accordance with FIG. 3. It differs from the two previously described information memories in such a way that the contact area 24 is replaced by a contact area 28 having the ohmic terminal contact 29. The contact area 28 also consists of a zone in the substrate which is highly doped opposite to the substrate. It is located at the surface of the substrate, at the electrode boundary below which the electrically insulating layer has the thinner layer thickness $d_1$. All other elements are referenced in the same manner as in FIG. 3. In FIG. 4, the potential curves illustrated in FIG. 1 are again authoritative. This information memory is operated in such a way that, for a reading-in of information, a voltage is applied to the electrode which, with respect to the reference voltage at the substrate terminal 21 is less than the voltage $U_0$. The local cure of the potential maximum M below the electrode is illustrated by the curve 46. A potential difference of ΔM is present at the step of the electrically insulating layer, and the absolute potential maximum is now located below the thicker electrically insulating layer. A voltage is applied to the contact area during the reading-in process, which, in magnitude, is larger than the smallest potential maximum or smaller than the maximum. The curve 46, for the first case, is continued below the contact area as a continuous line, while it is continued in broken-line fashion for the second case. Only in the second case can charges flow below the thicker electrically insulating layer. When information is stored, a voltage is applied to the contact area, which, in magnitude, is larger than the smallest potential maximum. For reading-out information, the electrode voltage is shifted in the direction of the voltage $U_0$ or beyond. Thus, the difference ΔM decreases, or even reverses. Care must be taken during the read-out process that the voltage at the contact area is selected to have a larger amount than the smallest amount potential maximum occurring.

The following values may be assumed as exemplary for the information memory illustrated in FIG. 4; a p-doped silicon substrate having a doping of $5 \cdot 10^{14}$cm$^{-3}$; an n-doped silicon layer having a doping of $10^{15}$cm$^{-3}$ and a layer thickness $t = 3$ μm; a substrate thickness T = 400 μm; a contact area of n-doped silicon having a doping of $1 \cdot 10^{20}$cm$^{-3}$; and a silicon dioxide electrically insulating layer having a thin portion of $d_1 = 120$ nm and a thicker portion $d_2 = 1200$ nm. During the read-in process and storage process, a voltage of 0 volts can be used as a electrode voltage, which causes a potential maximum of 3.3 volts below the thinner electrically insulating layer and a potential maximum below the thicker electrically insulating layer. For the read-out process, 30 volts may be assumed as the electrode voltage which causes a potential maximum of 2.6 volts below the thinner electrically insulating layer and a potential maximum of 27.3 volts below the thicker electrically insulating layer. The difference ΔM thereby changes from 4.1 volts, in the case of 0 volt electrode voltage, toward −2.3 volts in the case of a 30 volt electrode voltage. The voltage at the contact area is selected in the same manner as the previously described method, and it is selected larger than 30 volts, at least during the storage and read-out processes.

In the case of the previously described embodiments of an information memory constructed in accordance with the invention, it is possible to change the dielectric constant ε of the electrically insulating layer, instead of changing the thickness of the layer, or in addition to changing its thickness. It is thereby essential that the quotient ε/d either increases or decreases. It is generally advantageous when the change ε/d does not occur abruptly but continuously over the entire element. In this case, a large range for storing the information charge is then available. Of course, it is required for this purpose that suitable methods of production exists. It is also possible to use n-doped semiconductor material such as n-doped silicon as the substrate material. Only the polarity of the operational voltages must be changed during the operation of such elements.

Figure 5:
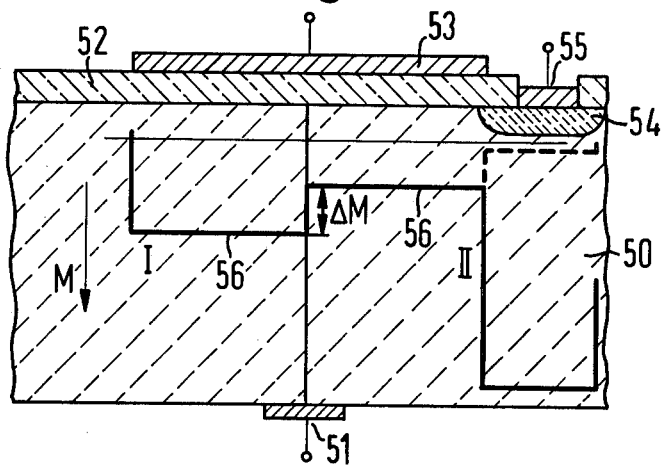
FIG. 5 illustrates a cross sectional view of an information memory wherein the substrate is divided into two adjacent differently doped halves.

FIG. 5 illustrates an informational memory constructed in accordance with the invention, wherein a difference ε/d upon the electrically insulating layer can be omitted. An electrically insulating layer having constant layer thickness and a constant dielectric constant is applied onto a substrate 50, for example n-doped silicon, having a substrate terminal 51. The substrate 50 is subdivided into two adjacent halves I and II, whereby the half II is more highly doped than the half I. An electrode 53 is applied onto the electrically insulating layer, above both halves I and II. At the surface of the substrate, a contact area 54—highly doped as compared with the substrate—is provided in the substrate, and is provided with an externally accessible ohmic terminal contact 55 doped opposite with respect to the substrate and consisting of the same material as the substrate. The zone 54 is thereby located at the boundary of the electrode and totally in the higher doped area II of the substrate. In this case, two electrode voltages $U_{01}$ and $U_{02}$ exists, whereby no field is present in the electrically insulating layer. The voltage $U_{01}$ is to be the voltage wherein no electric field is present in the electrically insulating layer 1, and the voltage $U_{02}$ is the voltage in which no field is present in the electrically insulating layer above the range II. For the electrode voltages having $|U| \leq |U_{01}|$ or with a polarity opposite to $U_{01}$, similar potential distributions resolved as they have been illustrated in the curves 11 or 12, respectively, of FIG. 1. The potential maximum is thereby of a larger amount in the range II than in the range I, and, in both cases, is located within the substrate. When the electrode voltage is moved away from the voltage $U_{01}$, the difference $\Delta M$ between the two potential maxima becomes greater. Similar potential distributions as they are illustrated in curves 13 or 14, respectively, will result for electrode voltages $|U| \geq |U_{0II}|$. The potential maximum in the range II is thereby of a larger amount than in the range I and, in both cases, is located at the surface of the substrate. If the electrode voltage U is moved away from the voltage $U_{0II}$, the difference $\Delta M$ between the potential maxima becomes greater. The conditions are more complicated for electrode voltages between $U_{01}$ and $U_{0II}$. However, an operation is also possible in this situation. A detailed explanation is not provided here since one skilled in the art can examine the conditions in such a case with the help of the solution of the Poisson equation, with the previously stated marginal and subsidiary conditions.

The information memory constructed in accordance with FIG. 5 is now operated in such a way, that for reading-in of information, an electrode voltage is applied to the electrode 53 and a voltage $U_K$ is applied to the contact area 54, which voltage is either larger or smaller than the smallest amount potential maximum at this electrode voltage. The curve 56 illustrates the paths of the potential maximum M below the electrode 54 having a potential jump $\Delta M$ at the separation surface between the zone I and the zone II below the contact zone 54. The first case is illustrated by the broken lines for the contact zone 54, and the second case is cotinuously indicated by solid line. During the storage process, a voltage is applied to the contact zone which has a larger magnitude than the smallest potential maximum. For reading-out of the information, the electrode voltage is shifted in a direction such that the potential difference $\Delta M$ is decreased. Thereby, a voltage is applied to the contact area which again is of a larger amount than the smallest potential maximum.

The following values may be used in constructing an information memory in accordance with FIG. 5: an n-doped silicon substrate having a doping of $5 \cdot 10^{14} cm^{-3}$ in the zone I and a doping of $5 \cdot 10^{15} cm^{-3}$ in the range II and having a thickness T = 400 μm; a p-doped silicon contact area having a doping of $1 \cdot 10^{20} cm^{-3}$; and a silicon dioxide electrically insulating layer having a layer thickness of 120 nm. An electrode voltage of −15 volts producing a potential maximum of −13.5 volts in the range I and of −10 volts in the range II, thus a potential difference of 3.5 volts, can be used for reading-in and storing information. A potential of −5 volts is suited as the electrode voltage for the read-out process which produces a potential maximum of −4 volts in the range I and of −2.5 volts in the range II. The potential difference $\Delta M$ thereby decreases to 1.5 volts. The voltage at the contact area 54 is preferably selected larger than −20 volts, at least during the storage and read-out processes.

Figure 6:
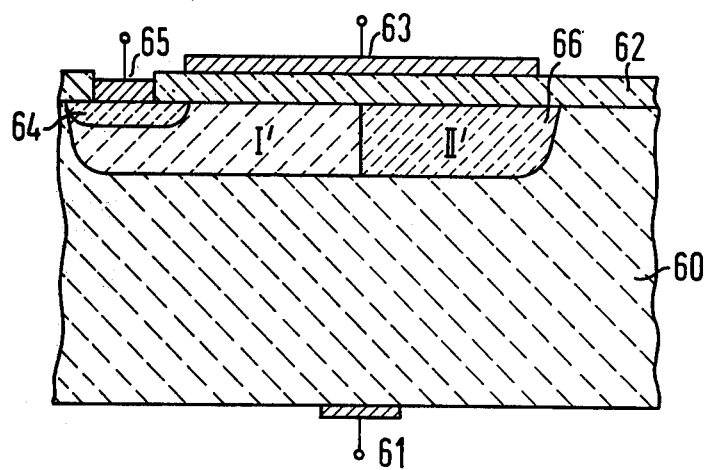
FIG. 6 illustrates a cross sectional view of an information memory wherein a layer doped opposite with respect to the substrate is present at the substrate surface and is subdivided into two adjacent differently doped halves.

FIG. 6 illustrates an information memory wherein an electrically insulating layer 62 has a constant layer thickness at a constant dielectric constant and is applied onto a doped substrate 60 having a substrate terminal 61 and an electrode 63. A contact area 64 having an ohmic terminal contact 65, doped opposite with respect to the substrate, is again present at the boundary of the electrode. In the substrate, at the surface facing the electrically insulating layer, there is a layer 66 of a doped semicoductor material which is doped opposite with respect to the substrate and which contacts the contact area.

The layer 66 is sub-divided into two halves I' and II', where only the half I' contacts the contact zone 64. The half II' is doped higher than the half I'. Furthermore, the half I' is doped less than the contact zone. The layer thickness t of this layer is less than the layer thickness of the substrate. This information memory is operated like the information memory constructed in accordance with FIG. 5. Only the voltage values, which are to be applied, and their polarity must be selected differently. The following values may be assumed as exemplary of this embodiment: a p-doped silicon substrate having a doping of $8 \cdot 10^{15} cm^{-3}$ and a thickness T = 400 μm; an n-doped silicon layer having a thickness of 1 μm, a doping of $8 \cdot 10^{15} cm^{-3}$ in the range I' and $16 \cdot 10^{15} cm^{-3}$ in the range II'; and an electrically insulating layer of silicon dioxide having a layer thickness of 120 nm. For reading-in and storing, an electrode voltage of 0 volts, with respect to reference potential, may be applied to the substrate terminal which produces an absolute potential maximum of 3.3 volts in the range I' and of 7.9 volts in the range II'. This corresponds to a potential difference $\Delta M$ of 4.6 volts. A voltage $U_2$ of 30 volts, with respect to the reference voltage, may be applied for the read-out process, which produces an absolute potential maximum of 27.5 volts in the range I' and of 30.7 volts in the range II'. The potential difference is thereby decreased by 1.4 volts, to become 3.2 volts. The voltage at the contact area is selected larger than 30 volts, at least during the storage and read-out process.

Figure 7:
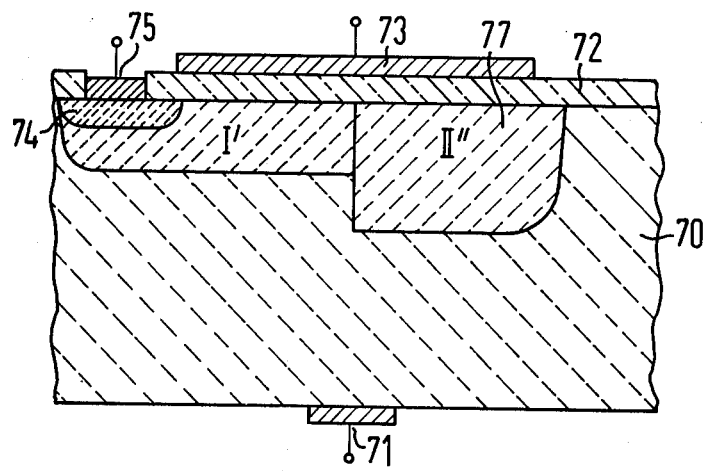
FIG. 7 illustrates a cross sectional view of an information memory wherein a layer doped opposite with respect to the substrate is present at the substrate surface and is subdivided into two adjacent halves of differing layer thicknesses.

FIG. 7 illustrates an information memory, wherein an electrically insulating layer 72 having constant layer thickness and constant dielectric constant, also, is applied onto a doped substrate 70 having a substrate terminal 71 and an electrode 73. Again, a contact zone 74 having an ohmic terminal contact 75 and doped opposite with respect to the substrate is present at the boundary of the electrode. A layer 77, made of doped semiconductor material doped opposite with respect to the substrate and touching the contact zone, is present in the substrate upon the surface facing the electrically insulating layer. This layer is again subdivided into two adjacent halves I'' and II'', wherein only the half I'' contacts the contact area. The half II'' comprises a greater layer thickness than the half I''. The entire layer 76 is homogeneously doped and has a lower doping than the contact zone. The same conditions hold true for the potential distributions in this information memory and for the operation as for the information memory constructed in accordance with FIG. 5, or with FIG. 6, respectively. The range I'' corresponds to the ranges I or I' and the range II" corresponds to the ranges II and II', respectively.

Two examples are provided for the above structure wherein

1. A p-doped silicon substrate has a doping of $10^{14} cm^{-3}$ and a thickness T = 400 μm; a layer 76 of n-doped silicon having a doping of $10^{15} cm^{-3}$, a layer thickness of 1 μm in the range I" and 9 μm in the range II"; and a silicon dioxide layer of 100 nm as an electrically insulating layer. For the read-in and storage processes, an electrode voltage of 30 volts can be used, which produces a potential maximum of 29.1 volts in the range I" and 29.7 volts in the range II". This results in a potential difference ΔM of 0.6 volts. An electrode voltage of 10 volts is applied for the read-out process which produces a potential maximum of 9.5 volts in the range I" and of 10 volts in the range II". The potential difference, accordingly, has decreased during the read-out process by the amount of 0.1 volts, to reach 0.5 volts. The voltage at the contact zone is selected greater than 30 volts, at least during the storage and read-out processes.

2. A p-doped silicon substrate having a doping of $8 \cdot 10^{15} cm^{-3}$ and a thickness T = 400 μm; an n-doped silicon layer having a doping of $8 \cdot 10^{15} cm^{-3}$ as the layer 76 with a layer thickness of 1 μm in the range I" and of 5 μm in the range II; and a silicon dioxide electrically insulating layer of 120 nm thickness. For the read-in and storage process, an electrode voltage of 0 volts can be used, which produces a potential maximum of 3.3 volts in the range I" and a potential maximum of 59 volts in the range II", which corresponds to a potential difference M of 55.7 volts. For the read-out process, a voltage of 30 volts can be used which produces a potential maximum of 27.5 volts in the range I" and of 77.4 volts in the range II". The potential difference ΔM thus decreases during the read-out process by an amount of 5.8 volts to reach 49.9 volts. The voltage of the contact area is selected preferably larger than 30 volts during the storage and read-out processes.

A variation of the information memory constructed in accordance with FIG. 7 consists in that the layer thickness in the range I" is equal to zero, in other words, that this range has the doping of the substrate. The following values can be selected for an exemplary embodiment: a p-doped silicon substrate having a doping of $8 \cdot 10^{15} cm^{-3}$ and a thickness T = 400 μm; an n-doped range II" having a doping of $8 \cdot 10^{15} cm^{-3}$ and a layer thickness of 1 μm; and a silicon dioxide electrically insulating layer having a layer thickness of 300 nm. For the read-in and storage processes, an electrode voltage of 20 volts can be applied, which produces a potential maximum of 17.9 volts in the layer and of 7.8 volts outside of the layer, corresponding to a potential difference of 10.1 volts. For the read-out process, an electrode voltage of 10 volts can be applied, which produces a potential maximum of 10.6 volts in the range II" and 2.8 volts beyond. Thus, the potential difference during the read-out process is decreased by 2.3 volts, to reach 7.8 volts. The voltage of the contact area is selected to be larger than 20 volts, at least during the storage and read-out process.

Each of the information memories constructed in accordance with FIGS. 1-4 may be combined with an information memory in accordance with FIGS. 5-7, or the variation of FIG. 7, respectively. The latter may also be combined with one another.

It is also possible to use a n-doped substrate in the place of a p-doped substrate.

In the case of the information memories constructed in accordance with FIGS. 5-7, and the variation of FIG. 7, it is not required that the surface density of the doping, which is related to the substrate surface, increases laterally step-like from the contact area, as stated in these embodiments, but the surface density may also increase continuously.

It should be expressly pointed out here that the examples set forth in the drawings represents specific embodiments of an information memory constructed in accordance with the invention. According to the initially mentioned teaching, it is also possible to provide more complex structures.

Figure 8:
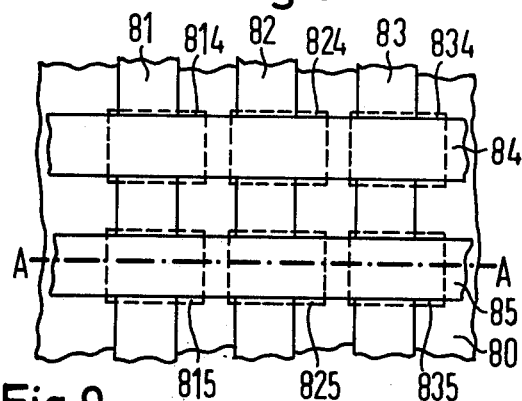
FIG. 8 illustrates a plan view of an organization form of a memory matrix having information memory elements constructed in accordance with the invention.

Information memories constructed in accordance with the invention can be organized to form a memory matrix in a very simple manner. A plan view of such an organization is illustrated in FIG. 8. Highly doped conductors 81–83, doped opposite with respect to the substrate, are present as column lines within a substrate 80 made of doped semiconductor material, extending parallel and spaced apart from each other. An electrically insulating layer, which has not been illustrated on the drawing for purpose of clarity, is carried upon the surface of the substrate. Upon this insulating layer, strips 84 and 85 of electrically conductive material are arranged adjacent to one another, as conductors, extending transversely over the column lines, the strips being arranged parallel and spaced apart. The memory elements are framed within a broken line and are provided with the reference characters 814–835.

Figure 9:
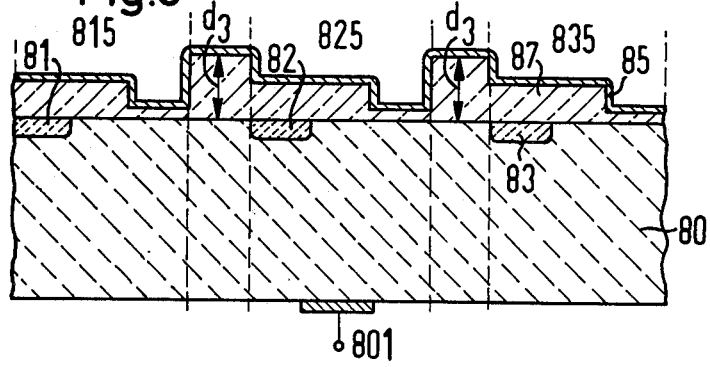
FIGS. 9 and 10 illustrate cross sectional views through a memory matrix constructed in accordance with FIG. 8, taken along a line having information memories constructed in accordance with FIG. 2 as matrix elements.
Figure 10:
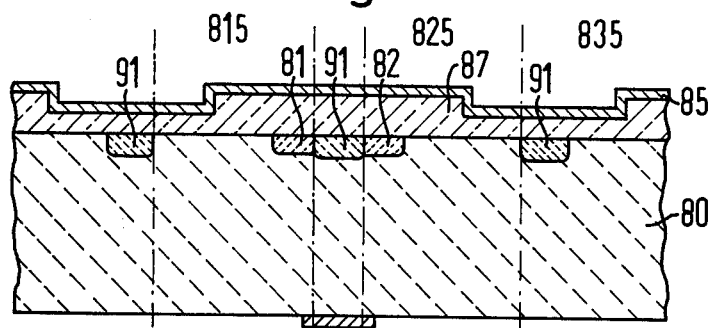

FIGS. 9–15 illustrate a cross sectional view taken along the parting line A—A of FIG. 8 for the construction of a memory matrix for the different exemplary embodiments illustrated in FIGS. 2–7. FIGS. 9 and 10 are based on the information memory illustrated in FIG. 2. The doped lines 81–83 take over the row of the contact zone in this case and in the following drawings, i.e. all information memories in a column are connected to a common contact zone. The electrically insulating layer 87 in FIG. 9 consists of three steps. This layer is stepped in accordance with FIG. 2 in the zones of the memory elements 815–835. In the intermediate range between two of these ranges 815–835, respectively, the electrically insulating layer has a greater layer thickness $d_3$ than in the remainder of the memory, at least below the line conductor. This serves for the separation of the individual memory elements from one another. This separation is effected in FIG. 10 with the help of a "channel-stop" diffusion, i.e. highly doped channels 91 are diffused parallel to the column lines and have the same kind of doping as the substrate. In addition, the memory elements 815–835 in FIG. 10 are not arranged upon the same side of the column line. The memory elements 815–835 in FIG. 10 are arranged on the left of the associated column lines 81–83 and the memory element 825 is arranged on the right side of the associated column line 82.

Figure 11:
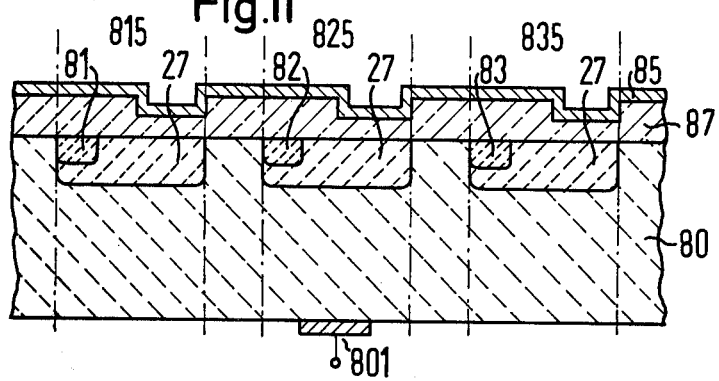
FIG. 11 illustrates a cross sectional view through a memory matrix in accordance with FIG. 8, along a matrix line having information memories constructed in accordance with FIG. 3 as memory elements.

FIG. 11 is based on a memory element constructed in accordance with FIG. 2. A separation between the individual elements is not required, so that the layer thickness in the ranges between two memory elements can be selected as desired. It may therefore be selected equal to the largest or smallest layer thickness in the memory element, which essentially simplifies production. In FIG. 11, the layer thickness in the interspaces is selected equal to the largest layer thickness in the memory element. Analogous to the structure illustrated in FIG. 11, a memory matrix may be designed when the memory element constructed as illustrated in FIG. 4 is used as a basis. The larger layer thickness in the range of the memory element is then located above the column line.

Figure 12:
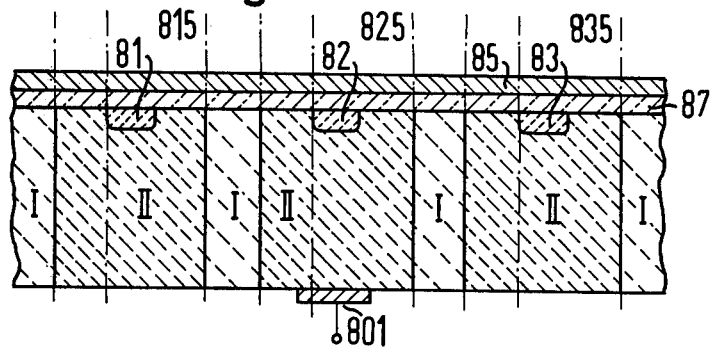
FIG. 12 illustrates a cross sectional view taken through a memory matrix in accordance with FIG. 8, along a matrix line having information elements constructed in accordance with FIG. 5.

FIG. 12 illustrates the design of a matrix which is based on the memory element illustrated in FIG. 5. The substrate is subdivided along the line conductor, alternately into weaker doped ranges I and higher doped ranges II. The separation of the individual memory elements 815-835 is again effected in such a way that an electrically insulating layer 87 has a greater layer thickness in the space between two such elements, at least below the line conductor.

Figure 13:
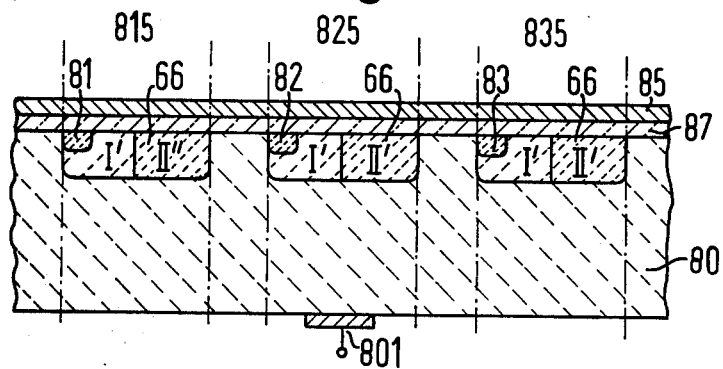
FIGS. 13–15, respectively, illustrate a cross sectional view through a memory matrix in accordance with FIG. 8, along a matrix line, wherein, one after the other, the information memories constructed in accordance with FIGS. 6, 7 and a variation of FIG. 7 are utilized as basic memory matrix elements.

FIG. 13 illustrates the design of a matrix which is based on the memory element illustrated in FIG. 6. The layer thickness of the electrically insulating layer 87 may remain constant since the layers 66 having the ranges I' and II' are already separated from one another.

Figure 14:
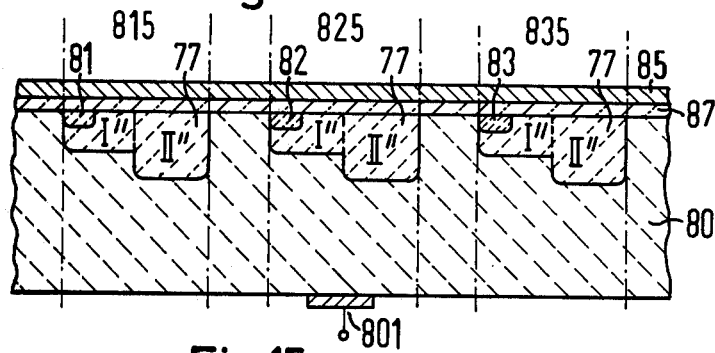

FIG. 14 illustrates the design of a memory matrix which is based on the information memory shown in FIG. 7 as the memory element. Here also, the electrically insulating layer may have a constant layer thickness, since the layers 77 having the respective ranges I'' and II'' are already separated from one another.

Figure 15:
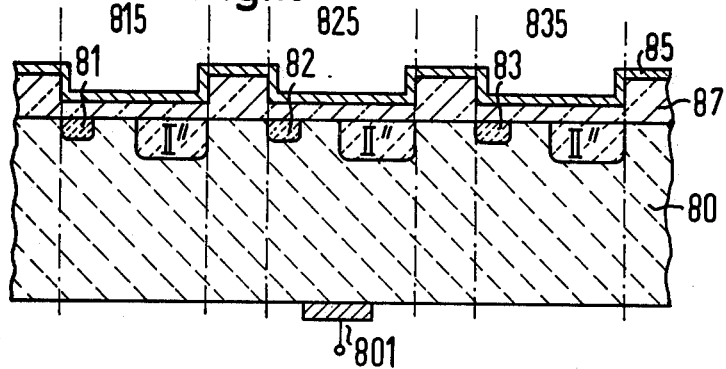

FIG. 15 illustrates the construction of a memory matrix, wherein the variation of the information memory element illustrated in FIG. 7 is used as the basis of the memory element. The individual memory elements, however, must here again be separated from each other. This again happens in such a way that the electrically insulating layer comprises a greater layer thickness, at least below the line conductor in the ranges between two memory elements.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. Information storage apparatus comprising a doped semi-conductor substrate, a substrate surface and a substrate terminal, a memory element carried by said substrate including an MIS capacitor comprising an insulating layer carried on said surface over said doped zone and a capacitor electrode carried on said insulating layer, a contact zone in said substrate and a contact terminal carried on said contact zone, said contact zone in contact with said MIS capacitor and comprising a material which provides a diode effect where said zone contacts the doped material of said substrate, at least one of the values of the ratio of the dielectric constant of the insulating material to the thickness $d$ of the insulating material, the surface density of substrate doping with respect to substrate surface in the area of the MIS capacitor, and the surface density of opposite substrate doping in an oppositely doped zone in the area of the MIS capacitor of the substrate is selected to respond to the application of a voltage across said substrate terminal and capacitor electrode to effect a local distribution of potential within said MIS capacitor, with respect to the contact area, which includes at least one increase from a minimum value to a maximum value.

2. The storage apparatus of claim 1 wherein said insulating layer extends beyond the area of said MIS capacitor and has a different $\epsilon/d$ ratio in the extended area wherein, for a homogeneously doped substrate, at least one of the values of the ratio of the dielectric constant of the insulating layer to the thickness of the layer, the surface density of substrate doping with respect to substrate surface in the area of the MIS capacitor, and the surface density of the substrate doping in the oppositely doped zone is effective to cause a local distribution of potential having at least one change from a predetermined value to a different value.

3. The storage apparatus of claim 1 wherein said contact zone comprises a doping opposite to that of said substrate which doping is higher than the remaining doping in the substrate.

4. The storage apparatus of claim 1 wherein said substrate except within the contact zone comprises a homogeneous basic type of doping.

5. The storage apparatus of claim 1 wherein said substrate comprises a predetermined thickness therein having a doping which is opposite to that of the remainder of the substrate within the range of the MIS capacitor, and wherein the remainder of the substrate, except within the contact zone, has a homogeneous basic type of doping.

6. The storage apparatus of claim 1 wherein the ratio $\epsilon/d$ of the electrically insulating layer in the MIS capacitor is constant throughout the layer.

7. The storage apparatus of claim 6 wherein the substrate, with the exception of the contact zone, has only the basic type of doping.

8. The storage apparatus of claim 7, wherein said substrate, in the range of the MIS capacitor, is subdivided into two adjacent, differently homogeneously doped halves, one of said halves adjacent to and contacting said contact zone, and the doping therein higher than within the other half.

9. The storage apparatus of claim 6, wherein said substrate, beyond said contact zone and beyond the oppositely doped zone, is homogeneously doped with the basic type of doping.

10. The storage apparatus of claim 9, wherein said substrate includes a layer which is doped opposite to the remainder of the substrate which is subdivided into differently homogeneously doped halves, the weaker doped half adjacent to and contacting said contact zone.

11. The storage apparatus of claim 9, wherein said substrate includes a layer which is doped homogeneously and oppositely with respect to the remainder of the substrate and which is subdivided into two halves of different thickness, the thinner of said half adjacent to and contacting said contact zone.

12. The storage apparatus of claim 9, wherein said substrate includes a layer which is homogeneously doped oppositely to that of the remainder of the substrate and which comprises a constant layer thickness, said layer spaced from said contact zone.

13. The storage apparatus of claim 1 wherein the dielectric constant $\epsilon$ is constant.

14. The storage apparatus of claim 13 wherein said layer has a thickness, along a predetermined direction laterally away from the contact zone, which has a change in thickness within the area of the MIS capacitor.

15. The information storage apparatus of claim 1, comprising, in combination, several of said memory elements arranged in a matrix formation of columns and lines commonly upon said substrate, a plurality of doped strips within said substrate, each carrying a terminal and each extending alongside the elements of a respective column and interconnected with the contact zones of the individual elements of that column, and a plurality of electrically conductive strips carried upon said electrically insulating layer transversely of said doped strips, forming the individual electrodes of the line.

16. The storage apparatus of claim 15, wherein said electrical insulating layer is a multi-thickness layer having at least the thickest portions thereof spaced below the line conductors between two adjacent elements.

17. The storage apparatus of claim 15, wherein said substrate has a greater doping at least below the line conductor in the range between two adjacent elements.

18. A method of operating an information memory of the type which comprises a semiconductor substrate including a doped zone, an oppositely doped zone, a substrate surface and a substrate terminal, a memory element carried by the substrate including an MIS capacitor comprising an insulating layer carried on said surface over said doped zone and a capacitor electrode carried on said insulating layer, a contact zone in said substrate and a contact terminal carried on said contact zone, said contact zone in contact with said MIS capacitor and comprising a material which provides a diode effect where said zone contacts the doped material of said substrate, and wherein at least one of the values of the ratio of the dielectric constant $\epsilon$ of the insulating layer to the thickness $d$ of the insulating layer, the surface density of substrate doping with respect to substrate surface in the area of the MIS capacitor, and the surface density of opposite substrate doping in the adjacent oppositely doped zone is selected to respond to the application of a voltage across said substrate terminal and said capacitor electrode to effect a local distribution of potential within said MIS capacitor, with respect to the contact area, which includes at least one increase from a minimum value to a maximum value, said method comprising the steps of: applying a reference voltage to the substrate terminal, for reading information into the memory applying an electrode voltage with respect to the reference voltage to produce a potential maximum difference $\Delta M$ in the MIS capacitor range, applying a voltage to the contact zone which has a magnitude which is either larger or smaller than the amount of the minimum local potential value, for storing information applying a voltage to the contact zone which has a larger value than the value of the minimum value, and for reading information out, applying an electrode voltage to provide a decrease in the maximum potential difference $\Delta M$, whereby the applied voltage to the contact zone is larger than the new minimum value.

* * * * *